(12) United States Patent
Humphrey et al.

(10) Patent No.: US 10,741,420 B2
(45) Date of Patent: ***Aug. 11, 2020

(54) WAFER MANUFACTURING CLEANING APPARATUS, PROCESS AND METHOD OF USE

(71) Applicant: International Test Solutions, Inc., Reno, NV (US)

(72) Inventors: Alan E. Humphrey, Reno, NV (US); James H. Duvall, Reno, NV (US); Jerry Broz, Longmont, CO (US)

(73) Assignee: International Test Solutions, Inc., Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/136,965

(22) Filed: Sep. 20, 2018

(65) Prior Publication Data

US 2019/0019694 A1 Jan. 17, 2019

Related U.S. Application Data

(63) Continuation of application No. 15/419,840, filed on Jan. 30, 2017, now Pat. No. 10,109,504, which is a
(Continued)

(51) Int. Cl.
*B08B 1/04* (2006.01)
*H01L 21/67* (2006.01)
(Continued)

(52) U.S. Cl.
CPC ........ *H01L 21/67011* (2013.01); *B08B 1/001* (2013.01); *B08B 1/04* (2013.01);
(Continued)

(58) Field of Classification Search
CPC ............... B24B 37/34; H01L 21/67028; H01L 21/67011; B08B 1/001; B08B 1/04; Y10T 29/49826; C23C 16/0227; G03F 7/70925
See application file for complete search history.

(56) References Cited

U.S. PATENT DOCUMENTS 9,595,456 B2 *  3/2017 Humphrey .............. B24B 37/34
10,002,776 B2 *  6/2018 Humphrey .............. B24B 37/34
(Continued)

*Primary Examiner* — Alexander Markoff
(74) *Attorney, Agent, or Firm* — Holland & Hart LLP

(57) ABSTRACT

A cleaning wafer or substrate for use in cleaning, or in combination with, components of, for example, integrated chip manufacturing apparatus. The cleaning substrate can include a substrate having varying predetermined surface features, such as one or more predetermined adhesive, non-tacky, electrostatic, projection, depression, or other physical sections. The predetermined features can provide for more effective cleaning of the components with which they are used, such as an integrated chip manufacturing apparatus in the place of the integrated chip wafer. The cleaning substrate can be urged into cleaning or other position by vacuum, mechanical, electrostatic, or other forces. The cleaning substrate can adapted to accomplish a variety of functions, including abrading or polishing. The cleaning substrate may be made by a novel method of making, and it may then be used in a novel method of use I combination with chip manufacturing apparatus.

7 Claims, 13 Drawing Sheets

Related U.S. Application Data continuation of application No. 13/971,619, filed on Aug. 20, 2013, now Pat. No. 9,595,456, which is a continuation of application No. 13/725,827, filed on Dec. 21, 2012, now Pat. No. 10,002,776, which is a continuation of application No. 12/760,543, filed on Apr. 14, 2010, now abandoned.

(60) Provisional application No. 61/169,007, filed on Apr. 14, 2009.

(51) Int. Cl.
*G03F 7/20* (2006.01)
*B08B 1/00* (2006.01)
*B24B 37/34* (2012.01)
*C23C 16/02* (2006.01)

(52) U.S. Cl.
CPC .......... *B24B 37/34* (2013.01); *C23C 16/0227* (2013.01); *G03F 7/70925* (2013.01); *H01L 21/67028* (2013.01); *Y10T 29/49826* (2015.01)

(56) References Cited

U.S. PATENT DOCUMENTS 10,109,504 B2 * 10/2018 Humphrey .............. B24B 37/34
2006/0008660 A1 * 1/2006 Parkhe ..................... B08B 1/00
428/446

* cited by examiner

WAFER MANUFACTURING CLEANING APPARATUS, PROCESS AND METHOD OF USE

CROSS REFERENCE TO RELATED APPLICATION

This Application is a continuation of U.S. Patent Applications entitled "Wafer Manufacturing Cleaning Apparatus, Process, And Method Of Use," Ser. No. 15/419,840, filed Jan. 30, 2017, which claims priority through Applicant's prior U.S. Patent Applications entitled "Wafer Manufacturing Cleaning Apparatus, Process, And Method Of Use," Ser. No. 13/971,619, filed Aug. 20, 2013, which claims priority through Applicants' prior U.S. Patent Applications entitled "Wafer Manufacturing Cleaning Apparatus, Process, And Method Of Use," Ser. No. 13/725,827, filed Dec. 21, 2012, which claims priority through Applicants' prior U.S. Patent Applications entitled "Wafer Manufacturing Cleaning Apparatus, Process, And Method Of Use," Ser. No. 12/760,543, filed Apr. 14, 2010, which claims priority through the Applicants' prior U.S. Provisional Patent Applications entitled "Wafer Manufacturing Cleaning Apparatus, Process, And Method Of Use," Ser. No. 61/169,007, filed Apr. 14, 2009, all of which prior Applications are hereby incorporated by reference in their entirety. It is to be understood, however, that in the event of any inconsistency between this specification and any information incorporated by reference in this specification, this specification shall govern.

TECHNICAL FIELD

The present disclosure relates generally to the field of cleaning materials for integrated circuit manufacturing equipment.

BACKGROUND

Integrated circuit chips are complex, typically highly miniaturized electronic circuits that can be designed to perform a wide variety of functions in electronics of nearly every kind. See an integrated circuit chip shown in FIG. 1 for example. Differing integrated chips include differing electrical components such as transistors, resistors, capacitors and diodes connected to each other in different ways. These components have differing behaviors, and assembling these differing components in myriad differing ways on chips yields similarly differing electronic functions performed by the differing chips.

As a result, integrated chips have become ubiquitous in electronics of nearly every type in the modern industrialized world. Consequently, the size of the worldwide integrated chip market has long been enormous.

Integrated chips are, however, difficult to manufacture, requiring super clean manufacturing environments and equipment. As these chips are manufactured, they too must be maintained in a super clean condition. The chip manufacturing process, however, necessarily leads to contamination of the chip manufacturing apparatus, which leads to contamination of the manufactured chips. This contamination can and often does damage or even ruin the resulting chips. Consequently, the chip manufacturing industry has long been engaged in seeking more effective, more efficient, and less costly techniques for maintaining a super clean environment during manufacturing of integrated circuit chips. See, e.g., U.S. Pat. No. 6,777,966 to Humphrey et al., which is hereby incorporated by reference.

In this regard, chips are commonly manufactured on "stages" in the chip manufacturing apparatus. Differing stages are used to form differing portions of electronic circuitry components on the wafer. See, e.g., U.S. Pat. No. 6,256,555 to Bacchi et al, U.S. Pat. No. 6,155,768 to Bacchi et al. A stage can often have a complex surface structure, including burls, flat areas, vacuum ports, and other structures. Id During wafer manufacturing, small particulate contaminate debris builds up on the equipment and the stages. For example, the build-up of particulate contaminants on stages can affect the focus and accuracy of the photolithography process during chip circuit production. Removing contaminants from the crevices, valleys, and other surface structure on the surface of the various stages and wafer handling equipment has long presented a substantial challenge.

Offline cleaning of stages and handling equipment commonly requires tool downtime and opening of the automated wafer handling equipment. The integrated circuit manufacturer incurs a significant cost as equipment downtime for this cleaning operation lowers production throughput.

In-line cleaning techniques have sought to avoid the need to shut down the wafer processing tool and to increase production efficiency and yield of integrated circuit wafers. One in-line cleaning technique has involved using a non-tacky polyimide surface on a cleaning wafer to collect debris via static charge on the wafer manufacturing stages and manufacturing apparatus. See, e.g., processes of such companies as Nitto Denko, Metron Technology, and Applied Materials. Other in-line cleaning techniques have utilized generally planar wafers or wafers with slight surface roughness produced with viscoelastic, polymers such as silicone (e.g., see additional processes of Nitto Denko, Metron Technologies, and Applied Materials).

Typically, the cleaning wafer substrates of the prior art have not had sufficient surface adhesion, or "tackiness," to achieve the desired level of debris collection. The reason for this short-coming is that if the level of surface adhesion is sufficient to remove the majority of the foreign particulates in a prior art planar wafer, the adhesion between the cleaning surface and the contact surfaces of the hardware often has prevented adequate release and removal of the cleaning wafer from manufacturing hardware, wafer stages, or chucks.

Consequently, the prior art cleaning wafers have typically been designed with limited or no tack, the result being that the use of a cleaning wafer in a planar wafer substrate without adhesive properties or insufficient adhesive properties typically has not sufficiently and effectively removed foreign matter or particulates. The prior art wafers have also commonly had planar surfaces, relying upon deformation of these surfaces when in contact with surfaces to be cleaned by them. The deformation is often accomplished by applying a vacuum, forcing the compressible cleaning wafer to deform against a mating surface of the surface to be cleaned by the cleaning wafer.

Also available are off-line cleaning methods such as use of a grindstone abrasion (ASML) combined with vacuum based particle collection to remove debris remaining after using the previously described cleaning wafer techniques. This type of cleaning process is an add-on feature at considerable cost. The grindstone cleaning also typically requires tool downtime and opening of the automated wafer handling equipment.

SUMMARY

The applicants have invented a cleaning wafer or substrate, related apparatus, and methods of manufacture and use for, among other things, removal of foreign matter and particulates from surfaces of automated and manual integrated chip manufacturing hardware, such as stages or wafer chucks and associated structures. In some embodiments, the shape and physical attributes of the cleaning wafer are preformed to provide varying surface features that matingly engage, surround, or abut the varying contours of the surface to be cleaned on an stage, chuck, or other aspect of chip handling or manufacturing equipment to be cleaned by the cleaning wafer.

In some embodiments, the cleaning wafer is especially suited to clean non-planar surfaces and interact non-destructively with those surfaces and their environment.

In certain embodiments, the structural surface and other features of a cleaning wafer, the size, shape, orientation, and location of the structural features may be varied significantly to accommodate different process tools, stages, chucks, or other components to be cleaned by the cleaning wafer.

In certain embodiments, these structural surface features may be formed in an elastic polymer substrate underneath the cleaning layer or added as separate features bonded to or laminated onto the cleaning substrate. The structural feature may consist of one or more cleaning polymers and underlying primary substrates, other elastic polymers having varying tack levels, other polymers of variable compressibility, or other polymers that exhibit little or no tack properties.

In certain embodiments, the cleaning wafer is made of polymer or similar resilient material and the cleaning surface of the cleaning wafer is sufficiently compliant to deform around the burls and micro-burls and collect debris that may have accumulated around the periphery of the pin contact surface on a chip manufacturing stage.

In some embodiments, foreign matter may be removed from the wafer handling hardware and stages by using the adhesive or tacky property of the cleaning section of the cleaning wafer.

Certain embodiments include one or more compressible offsets or other specifically located surface features or projections on or formed within a cleaning wafer. In some embodiments, these features can reduce or prevent surface contact with the wafer handling hardware, stage, or chuck until vacuum, electrostatic, or other force collapses the target offset or other surface feature or projection.

In some embodiments, upon compression of the wafer's projecting compressible offset surface features, greater, and in some cases, full surface contact of the cleaning media can be made with the surface to be cleaned.

In certain embodiments, upon release of the vacuum, electrostatic or other force, the wafer's projecting compressible offset or varying features can have sufficient resilience to rebound and release the adhesive cleaning surface from the chip manufacturing hardware, stage, or chuck, thereby removing the foreign particles from the cleaned surface.

In some embodiments, various types of compliant and geometrical features on the cleaning substrate prevent catastrophic adherence at different steps within the wafer handling and placement sequence.

In certain embodiments, the compliance characteristics of the cleaning wafer substrate may be altered by including multiple layers or sections with different compliance properties to improve the conformability around the geometric features of the chip manufacturing hardware, such as stage, in order to achieve maximum foreign particle contact and removal.

In some embodiments that include a pin or burl chuck on the stage, for example, the cleaning wafer's projecting compressible offset features can be pre-positioned at locations outside the pin area or in specific locations within the pitch of the pins and burls so a differing wafer section, such as, for example, a flat, tacky cleaning surface, may contact the pin tips or other desired section of the chuck, to remove debris.

In some embodiments, the featured structures of the cleaning wafer may be formed from a non-tacky resin to provide offset to the surface so that the cleaning polymer may be positioned in the recessed area between the offset or varying structures in or on the cleaning wafer.

In certain embodiments, the predetermined substrate features or protrusions may consist of cleaning materials and the bare wafer or non-tacky resin may reside between the protrusions to provide cleaning into corresponding adjacent recessed areas of a stage or other structure to be cleaned.

In some embodiments, some wafer handling hardware, stages, and chucks may have limited and discrete components that may be damaged by contact with cleaning media. In such cases, the cleaning wafer may have differing sections with varying degrees of surface tack to allow cleaning of, for example, ejector pins or specific burl areas with high surface tack while sensitive or problem areas, such as that for cleaning an outer sealing ring, may have relatively less or no tack, in order, for example, to allow vacuum sealing to, and release from, the ring upon removal of the vacuum.

In some embodiments, the features may be molded directly into the cleaning material eliminating the need for additional materials in the structure. In certain embodiments, instead of forming the surface features from a single polymeric material, various features may be created and located across the cleaning surface by adhering separate geometric features made from the same or differing elastomeric polymer or resin materials. For example, geometric offset features such as hemispheres, pyramids, or other geometries may be formed separately from a hard resin and then adhesively bonded to the cleaning polymer surface.

In some embodiments that include a cleaning wafer handling chuck with one or more vacuum ports, grooves, or nipples, the locations of the compressible offset features are predetermined and located on the cleaning wafer to facilitate debris collection from within the area circumscribed by the vacuum features.

In at least one embodiment, one or more components of a chip manufacturing and handling system (such as transport equipment, rotation and alignment equipment, stages, or chucks) can be cleaned by the use of a cleaning wafer having a shape predetermined to facilitate transport of the cleaning wafer through the wafer processing equipment.

In some embodiments, abrasive filler particles of aluminum-oxide, silicon-carbide, diamond, or other materials may be utilized in conjunction with a cleaning wafer to provide a scrubbing action, in order to dislodge tenacious particulates from the flat surface or the burls and microburls of the wafer chuck.

In some embodiments, the electrostatic charge of the cleaning wafer surface may be altered to improve the attraction to foreign particulate matter.

In some embodiments, conductive filler may be added to the composition of the cleaning surface polymer on or in the cleaning wafer. In some embodiments, doing so can improve the cleaning wafer's electrostatic hold-down force when used to clean wafer chucks.

In some embodiments, the cleaning wafer or substrate may then be implemented in standard automated wafer handling equipment under normal processing conditions. Specially adapted equipment may also be utilized, but in some embodiments, one aspect of the cleaning process can allow use of the cleaning in line during the wafer manufacturing process and without need for customized equipment.

It is understood that the foregoing Background and Summary recites some but not all aspects of the background art and some, but not all aspects, features, and advantages of differing embodiments of this specification. It is therefore also to be understood that all embodiments will not necessarily address issues noted in the Background. Additional aspects, features, and advantages of the embodiments of this specification will become apparent as this specification proceeds.

BRIEF DESCRIPTION OF THE DRAWINGS

The applicants' preferred and other embodiments are set forth in association with the accompanying drawings in which.

Figure 1:
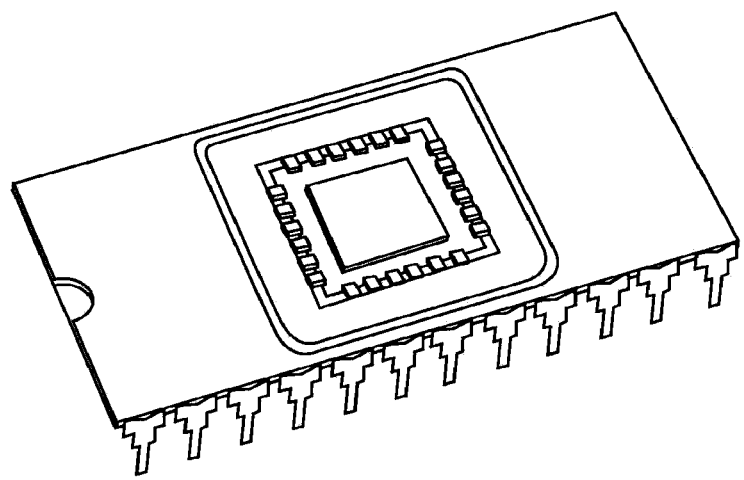
FIG. 1 is a perspective view of a prior art integrated circuit chip.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, one of ordinary skill in the art will understand that the exemplary embodiments described herein are not intended to be limited to the particular forms disclosed.

DETAILED DESCRIPTION OF EXEMPLARY EMBODIMENTS

Figure 2:
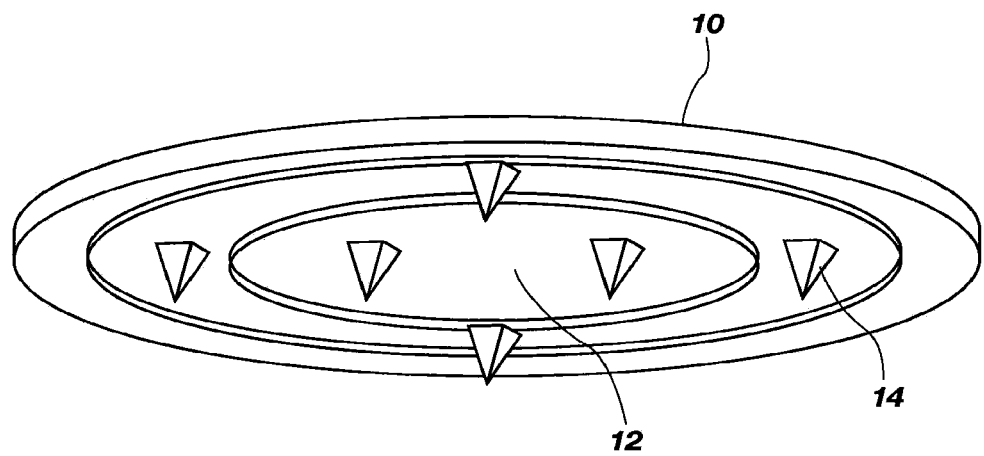
FIG. 2 is a perspective schematic view of the underside, cleaning side of one embodiment of a cleaning wafer with multiple protruding points or peaks extending from the surface of the cleaning wafer.
Figure 3:
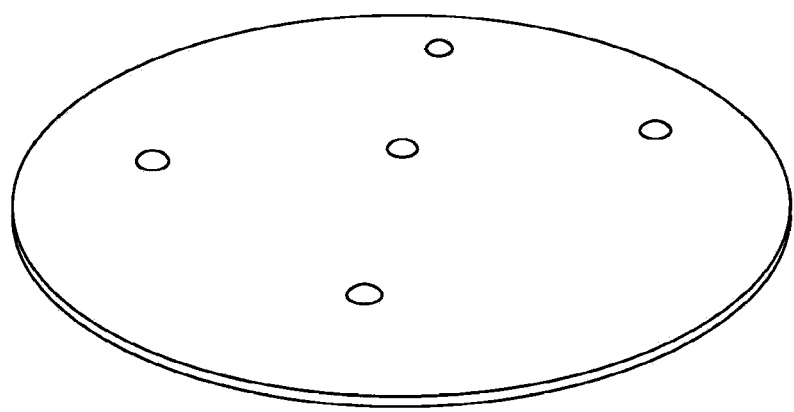
FIG. 3 is a perspective view of a cleaning wafer with rounded protrusions.
Figure 4:
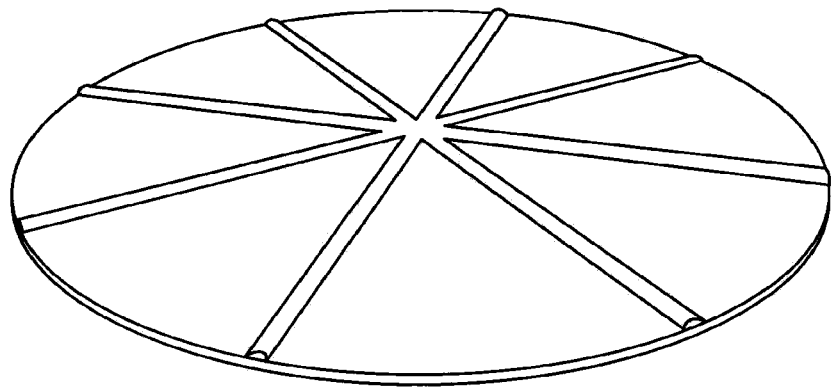
FIG. 4 is a perspective view of an embodiment of a chuck cleaning wafer having multiple preformed radial ridges extending outwardly from the surface of the cleaning wafer.

With reference to FIG. 2, a wafer substrate 10 is affixed to a cleaning polymer sheet or cleaning surface 12 with the cleaning polymer sheet 12 containing discrete protruding and other surface features 14 (shown as conical or pyramidal in FIG. 2). In some embodiments, these discrete protruding surface features 14 are compressible. The wafer substrate 10 is disc shaped and is made of silicon or any other material that allows processing through wafer handling equipment. In certain embodiments, the geometry is such that it is compatible with wafer handling equipment, such as, for example handling equipment sized 150 mm, 200 mm, 300 mm or 450 mm in diameter and about 0.022 inches to 0.033 inches in thickness. In some embodiments, the cleaning polymer 12 is comprised of an elastic polymer and may be an acrylic rubber, a urethane rubber, a butadiene rubber, a styrene rubber, a nitrile rubber, or silicone rubber or any other polymer that has a controlled surface tack, or surface adhesion, and does not transfer materials.

Figure 20:
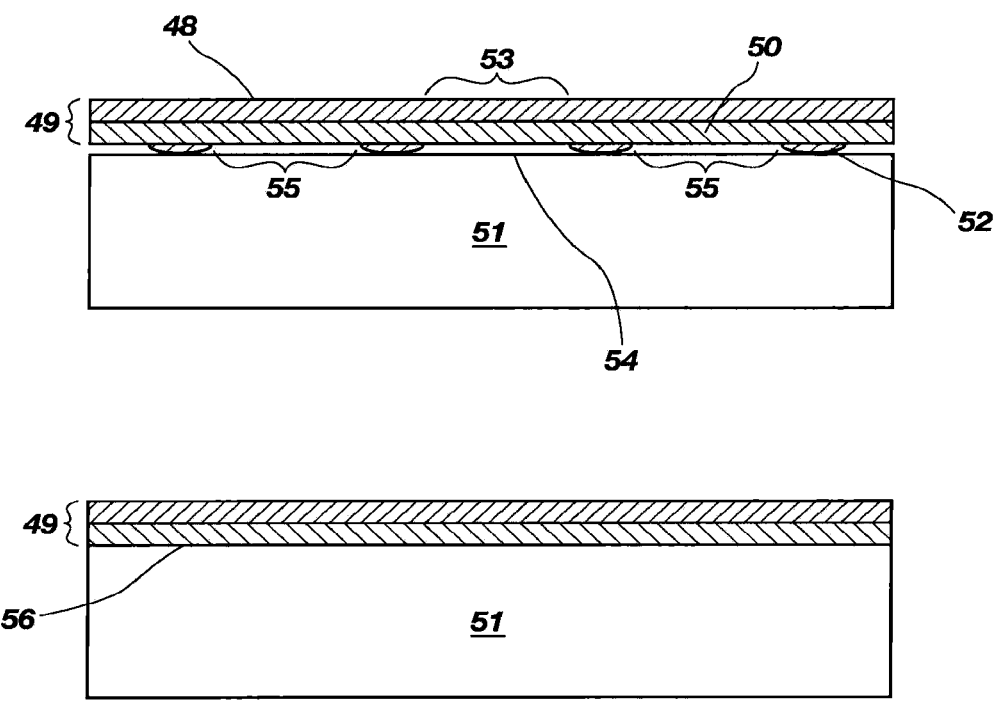
FIG. 20 is a side view of the surface features compressing and allowing contact between the cleaning polymer and a flat wafer stage.

Referring now to FIG. 20, the elastic cleaning polymer 50 may be formed on the wafer base surface or substrate 48 to produce protruding surface features, e.g., 52, that provide offset or minimal contact with the flat surfaces 54 of the wafer handling hardware 51 until a vacuum or electrostatic force is applied. The application of predetermined force to the cleaning wafer 49 can collapse the offset features e.g., 52, enabling the cleaning polymer 50 to come into contact with, and matingly abut, the surface 54 of the wafer handling hardware 51. With the release of the compression force, the resiliency of the protruding and compressible surface features, e.g., 52, urge them to resume their former shape, i.e., non-compressed form, to thereby separate the elastic cleaning polymer 50 from the surface 54 of the wafer handling hardware 51. Due to the surface adhesion properties of the cleaning polymer 50, the undesirable debris adheres to the cleaning polymer 50 and is thus removed from the flat surface 54 of the wafer handling hardware 51.

In some embodiments, wafer cleaning substrate material 50 is made of silicone, acrylic, polyurethane or any other elastic polymer that may be formed with a surface tack property between about 0.1 psi and 10 psi. In certain embodiments, the elastic cleaning polymer material 50 is processed to be durable under repeated handling without a reduction in surface tack. In some embodiments, the material is sufficiently processed and/or crosslinked such that transference from the cleaning surface to the wafer handling hardware 51, wafer stage, and wafer chuck does not occur. It is to be understood, however, that materials other than polymers may be used to provide a substrate.

In some embodiments, control of surface tack and material transference of the elastic cleaning polymer 50 is achieved in the polymer phase by the level of crosslinking density after processing. In a silicone embodiment, the tack of the polymer surface can be controlled by the ratio of platinum catalyst and multi-functional crosslinking resin to the long chain gum polymer in the addition cure system. Some embodiments may also use a free radical curing system with the addition of peroxide curing agents in a poly-dimethylsiloxane polymer system. Higher levels of catalyst and crosslinking resin result in lower surface tack polymers in the addition cure system. Higher levels of peroxide curing agent result in lower surface tack polymers in the free radical cure system. Low surface tack polymers will exhibit a Shore A durometer level above 80, while high surface tack polymers will exhibit a Shore A durometer less than 35. An example of each system is Wacker Silicones Elastosil M 4670 and Wacker Silicones Elastosil R401/70. Post processing to achieve desired surface tack levels and to remove free low molecular weight volatile material that may contribute to transference is completed at 200° C. to 300° C. under vacuum of 25 in. Hg for 60 minutes minimum. In some embodiments, this process can serve to reduce or eliminate material off gassing according to gas chromatography testing at 150° C. for 60 minutes. Low molecular weight volatile materials can be driven off as seen through gas chromatography testing and additional crosslinking can be achieved during the post processing cycle as seen by an increase in durometer and material hardness testing.

In certain embodiments, filler materials may be added to the elastic cleaning polymer 50 to adjust the surface tack, change the color, or provide a polishing action in addition to the tack for debris collection. Control of surface tack and material hardness is achieved in the polymer compound by the addition of particulate filler materials and as used in the fashion described herein. In that manner, the application of the cleaning wafer with these types of filler can accomplish abrasive cleaning through the typical contact between the elastic cleaning polymer 50 containing the added abrasive filler materials and the wafer handling equipment surfaces. In at least one embodiment, the filler material is aluminum oxide with an average particle size of 0.5 microns at a loading of 70% of the total compound weight. The particle size can range from 0.25 micron to 25 micron and the weight % loading can vary from 5% to 90% of the total compound weight. The filler particle selected should have a hardness number on the Mohs scale of 6 minimum. In some embodiments, the addition of filler particulate can affect Shore A hardness of the compound from below 35 to above 80 as the loading level increases.

In some embodiments, the electrostatic capability of the cleaning wafer 49 is enhanced with an electrostatic filler, for example a metallic composition or compound interspersed within the cleaning polymer 50 material in a fashion well known in the art. This electrostatic filler can then be urged as desired into contact with the associated structure in the wafer manufacturing and wafer handling equipment that use electrostatic force systems.

Figure 18:
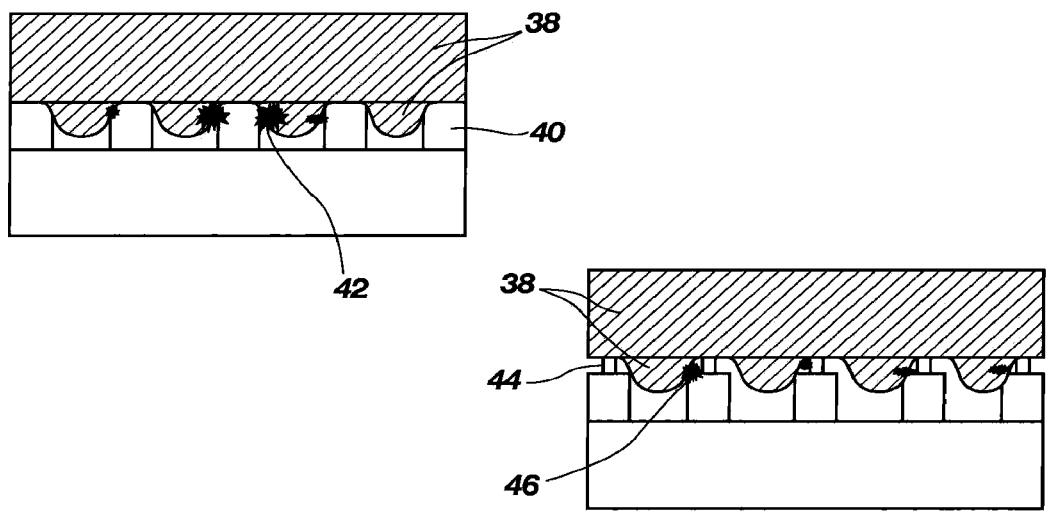
FIG. 18 is a perspective view of a compliant cleaning polymer conforming around the burls and micro-burls on a pin chuck stage.

In reference now to FIG. 18, in at least one embodiment, the thickness of the cleaning polymer sheet 38 is preferably about 0.001 inches to 0.010 inches. In some embodiments, the thickness of the cleaning polymer sheet 38 is sufficient to allow the material to deform around the burls, e.g., 44, and micro-burls, and collect debris, e.g., 42, that has accumulated around the periphery of the pin, e.g., 40, contact surface. Typically polymer compounds that exhibit high surface tack levels, such as above 3.0 psi, that deform more readily with a durometer level below Shore A 50, will be used for wafer chuck pin arrays that have large pins and larger pitch between pins. Typically polymer compounds that exhibit low surface tack levels, such as below 3.0 psi, that are less compliant, such as durometer above 50, will be used for wafer chuck pin arrays that have small pins and small pitch between pins and therefore high pin count per surface area.

Referring again to FIG. 2, in certain embodiments, the discrete protruding surface features, e.g., 14, may be formed up to about 0.080 inches high and may be oriented on the wafer substrate 10 to (i) contact or avoid certain areas of wafer handling hardware (not shown in FIG. 2) and the flat stage (not shown in FIG. 2) such as vacuum ports, etc, or (ii) to avoid the burls on a pin chuck surface (not shown in FIG. 2). In at least one embodiment, the protruding discrete surface features, e.g., 14, are 0.020 inches high and are compression molded into or onto the surface of the cleaning material. The molding is performed with a compression plate (not shown in FIG. 2) with a cavity (not shown in FIG. 2) having the shape of the desired feature pattern and geometry. The compression plate press is typically held at 150° C. for 30 minutes under 1 to 5 pounds per square inch pressure to form the features.

In some embodiments, an adhesive layer such as silicone or acrylic pressure sensitive adhesive (not shown in FIG. 2) bonds the cleaning polymer sheet 12 to the bare silicon wafer used as wafer substrate 10. In some embodiments, the cleaning polymer sheet 12 extends across the wafer or wafer-like substrate surface 10 for complete coverage without any exclusion area. In certain embodiments, as needed, an edge exclusion (not shown in FIG. 2) to expose the wafer bead or protrusion, e.g., 14, may be incorporated. An edge exclusion can be created by laser removal of the outer one to two millimeters of the cleaning polymer sheet 12.

Figure 5:
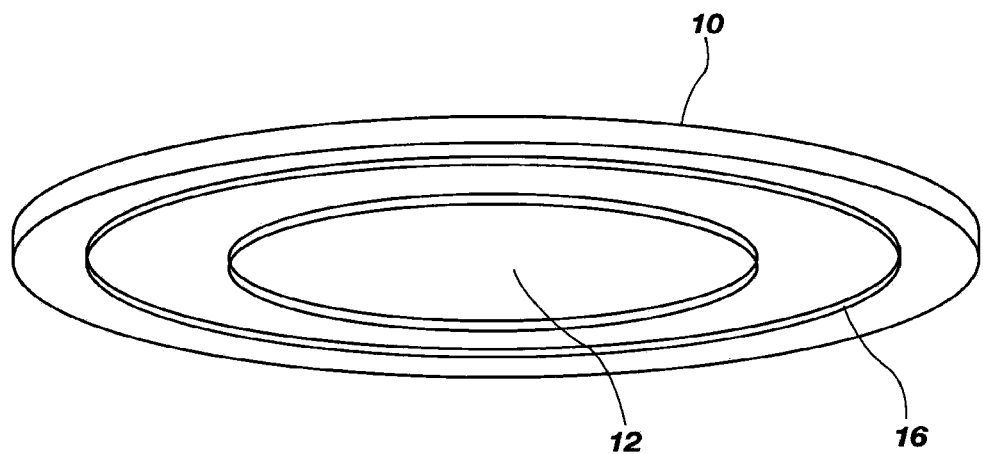
FIG. 5 is a perspective view of an embodiment of a chuck cleaning wafer having differing protruding circular ridges.
Figure 6:
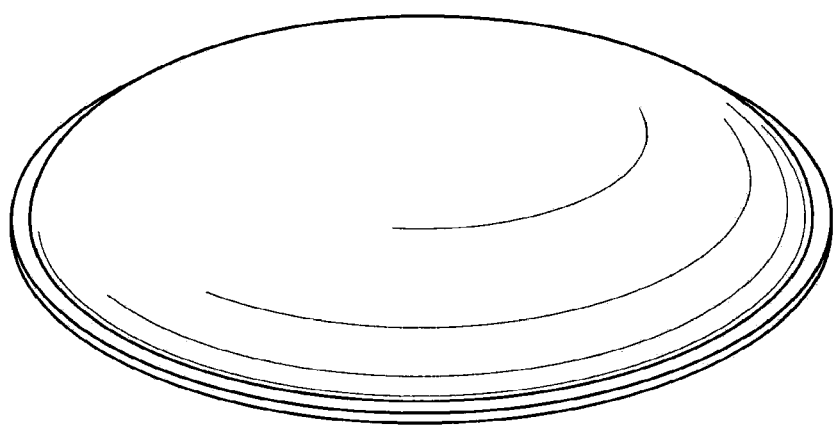
FIG. 6 is a perspective view of underside of a chuck cleaning wafer embodiment have a protruding edge ring.

With reference to FIG. 5, a wafer substrate 10 is affixed to the cleaning polymer sheet 12 with the cleaning polymer sheet containing ring-shaped protrusion surface features, e.g., 16. The ring-shaped protruding features, e.g., 16, may be formed up to about 0.080 inches high from the wafer's base surface and may be oriented on the wafer substrate 10 to contact features on the wafer handling hardware in order to prevent or diminish contact of the cleaning polymer sheet with certain areas of wafer handling hardware and flat stage areas, such as, for example, vacuum ports, or burls on a pin chuck surface (not shown in FIG. 5).

Figure 7:
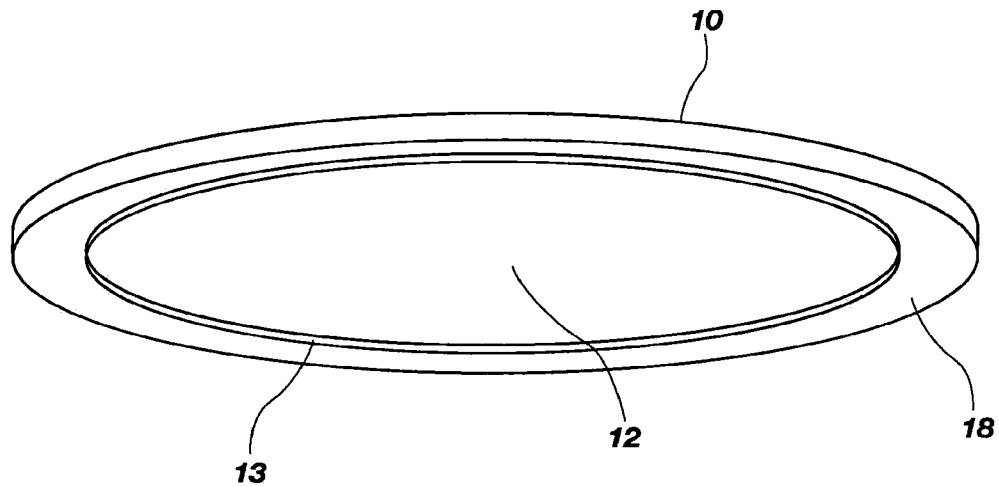
FIG. 7 is a perspective view of an exemplary flat cleaning wafer with differing circular tack areas.

Referring now to FIG. 7, a wafer substrate 10 is affixed to the cleaning polymer sheet 12 with a distinct area of different surface tack 18. The thickness of the distinct area of different surface tack 18 is substantially the same as the cleaning polymer area 12. The tack level of the distinct area of different surface tack or variant tack area 18 is sufficient to allow the material to release from certain wafer handling equipment such as a vacuum ring (not shown in FIG. 7). The variant tack area 18 may be oriented on the wafer substrate 10 in various geometries to contact or avoid certain areas of wafer handling hardware (not shown here) such as, for example, vacuum ports or rings (id.).

For example, with reference now to FIG. 20, in some embodiments a cleaning wafer 49 comprising wafer substrate 48, polymer cleaning surface 50, and compressible offset surface features, e.g., 52, may also have: (i) sections of no surface tack, e.g., 53, on the cleaning wafer surface 50 that may come into contact with sensitive features on the opposing surface 54 of the wafer handling equipment 51 (such as vacuum ports or rings (not shown in FIG. 20)); as well as (ii) areas of positive tack, e.g., 55, on the polymer cleaning surface 50.

Returning now to FIG. 7, the variant tack area 18 of the cleaning wafer polymer surface 12 is produced by the placement of a rigid, tack free plastic film 13 that has similar thickness to the adjacent cleaning polymer layer 18. The rigid, tack free film 13 is bonded to the silicon wafer with an adhesive layer (not shown in FIG. 7) between the film 13 and the cleaning polymer layer 18. In some embodiments the adhesive is a silicone or acrylic pressure sensitive adhesive. Also, in some embodiments the rigid, tack free film is comprised of polyethylene terephalate (PET).

In some embodiments the adhesive layer (not shown in FIG. 7) is comprised of silicone or acrylic pressure sensitive adhesive. The thickness of the adhesive layer (not shown) can range from 0.0001 inches to 0.010 inches with the thickness in some embodiments being 0.003 inches. The adhesive will have an adhesion level of 1.5 to 2.5 pounds force per linear inch wide according to the PSTC101 test method. In some embodiments, the adhesive is pressure sensitive; however, the adhesive may be a non-tacky bonding adhesive such as a heat seal, sealant or thermoset adhesive comprised of silicone, acrylic, polyurethane, cyanoacrylate or any other suitable material.

The cleaning polymer sheet 12 extends across the wafer or wafer-like substrate surface 10 for complete coverage without any exclusion area. If desired, the cleaning wafer substrate may have an edge exclusion or lip section (not shown in FIG. 7), to expose the wafer bead (not shown in FIG. 7).

Figure 8:
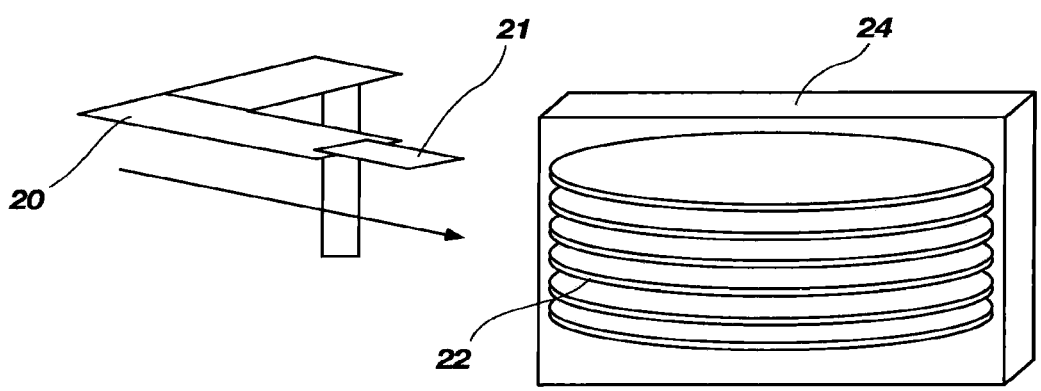
FIG. 8 is a perspective view of a wafer handling arm retrieving the cleaning wafer from a wafer tray.

With reference to FIG. 8, in some embodiments, one or more chuck cleaning wafers, e.g., 22, may be processed, loaded into, and unloaded by, a wafer handling arm 20, from a wafer carrier or wafer tray 24 capable of containing one or more cleaning wafers, e.g., 22. The wafer handling arm 20 is part of the wafer processing tool (not shown in FIG. 8). This wafer processing tool may be a photolithography tool such as a stepper or scanner. The tool may also be a chemical vapor deposition tool (CVD) or a plasma vapor deposition tool (PVD). These types of tools are supplied by companies such as Applied Materials, ASML, Canon, Nikon, etc.

Continuing with reference to FIG. 8, the end effector 21 (also e.g., with reference to FIG. 9, 60, with reference to FIG. 10, 70, with reference to FIG. 11, 80, with reference to FIG. 12, 90, and with reference to FIG. 13, 100) of the wafer handling arm 20 is typically the device at the end of the wafer moving arm 20 that contacts the cleaning wafer 22 and secures it, in some embodiments, with a vacuum force as the wafer 22 is typically lifted and moved by the wafer handling arm 20. In some embodiments, the wafer handling tool (not shown in FIG. 8) has a vacuum gauge (not shown in FIG. 8) that measures the strength of the vacuum seal between the cleaning wafer 22 and the wafer handling arm's 20 end effector 21. If the vacuum seal is not sufficient to hold the cleaning wafer 22 securely on the wafer handling arm 24, the chuck cleaning wafer 22 is not moved.

In some embodiments, upon being transported through the wafer handling equipment by the wafer handling arm 24, the cleaning wafer 22 is positioned over the surface of the wafer handling stage (not shown in FIG. 8) to be cleaned and placed upon the wafer handling stage's retractable ejector pins (not shown in FIG. 8). In some embodiments, the ejector pins, mounted in the wafer stage, also use a vacuum force to hold and position the chuck cleaning water 22 in place. The wafer handling equipment then handles the cleaning wafer 22 as it would a chip wafer. That is, the wafer stage's ejector pins retract, placing the cleaning wafer 22 on the surface of the wafer handling equipment to be cleaned; the cleaning wafer 22 is impelled into contact with the wafer handling equipment, impelled, for example, by vacuum, electrostatic, or mechanical forces; the cleaning wafer 22 is then released by the forces impelling it into contact with the wafer handling component surface (not shown in FIG. 8); the wafer stage's ejector pins extend and convey the cleaning wafer 22 back into a position where the end effector 21 of wafer handling arm 24 re-attaches to the cleaning wafer 22; and the wafer handling arm 24 removes the cleaning wafer 22 from the wafer handling component and returns it, in some embodiments, to a wafer carrier or wafer tray 24.

In some embodiments, the cleaning wafer or cleaning wafers 22 are automatically removed from the wafer carrier or wafer tray 24 by the wafer handling arm 20 and cycled through processes of the tool under normal conditions. The cleaning wafer 22 is cycled with the cleaning media typically facing down throughout the handling process so that the cleaning polymer sheet 12 (not shown in FIG. 8) may contact the flat surfaces of the handling arm 20 thereby removing loose foreign particulate matter from the handling arm surface. Handling of the cleaning wafer 22 by the handling arm 20 is facilitated by the cleaning polymer surface 12 features shown in FIG. 2 as discrete surface features 14, also shown in FIG. 5 as ring-shaped surface features 16, which keep the cleaning surface 12 offset from the surfaces of the handling equipment. FIG. 7 illustrates example variant tack areas 18 that allow processing of the cleaning wafer 22 by facilitating release from wafer handling arm 20.

Since chuck cleaning wafers 22 typically exhibit surface tack properties to clean the wafer chuck (not shown in FIG. 8), the tacky cleaning surface (12 as showing in FIG. 7) of the cleaning wafer 22 tends to adhere to the flat surfaces of an end effector 21 interfering with the release of the cleaning wafer 22 at the next station. The discrete surface features (14 as shown in FIG. 2) of the cleaning wafer 22 are predetermined to reduce or minimize surface contact between the cleaning wafer 22 and the end effector 21 and allow the cleaning wafer 22 to release from the end effector 21 and other components of the wafer handling mechanism, for example the wafer handling arm 20 while still retaining the surface tack required for proper removal of debris from the wafer chuck (not shown in FIG. 8). In some embodiments, the surface features of the cleaning wafer 22 can be designed to reduce or minimize contact with the flat surfaces of the end effector 21 and rotational rings (not shown in FIG. 8) while still allowing the vacuum seal to occur. Without a proper vacuum seal, some embodiments of the wafer handling tool (not shown in FIG. 8) will report a vacuum error and return the cleaning wafer 22 to the original loading tray 24 without processing it 22 as desired to effect cleaning. When all vacuums are pulled, full contact does place usually—at least enough to clean the tool and provide recoil.

In some embodiments, end effectors (e.g., those referenced in FIG. 9 through FIG. 13) are somewhat interchangeable and their design typically varies from tool to differing tool. The predetermined design of the discrete feature pattern on the chuck cleaning wafer 22 is based on the geometry and operation of the end effector 21 and, for example, rotational rings (not shown in FIG. 8). Thus, in some embodiments the cleaning wafer 22 can be customized to conform to the particular geometry and operation of the particular wafer handling tool component to be cleaned by the cleaning wafer.

Figure 9:
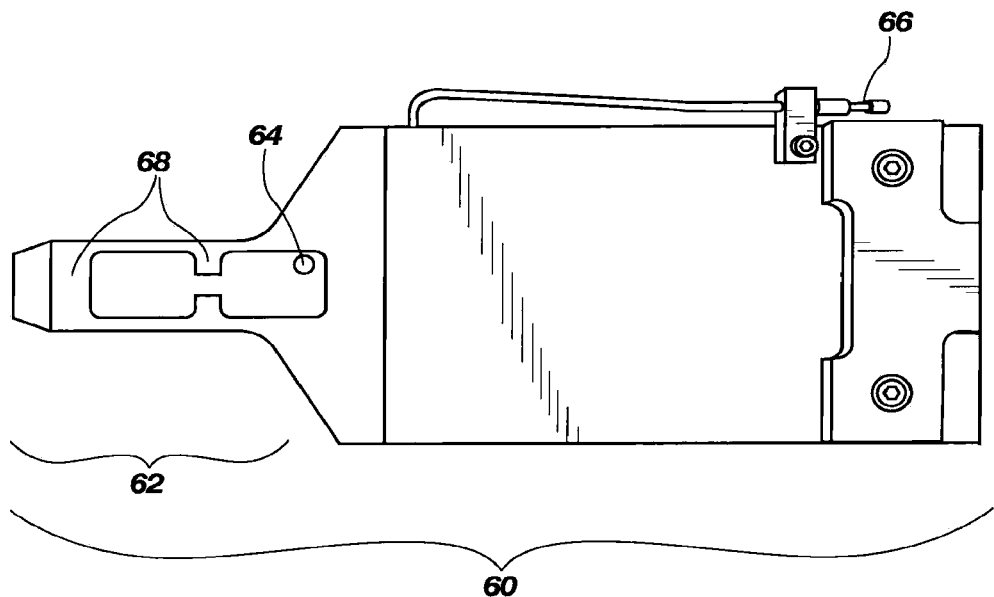
FIG. 9 is a plan view of a bronze end effector with a vacuum cavity and port.

With reference to FIG. 9, in some embodiments, a bronze end effector 60 has a vacuum port 64 connected to, and evacuated through, vacuum tube 66 in order to secure the cleaning wafer (not shown in FIG. 9 but see FIG. 8, 22)

during transport. The cleaning wafer will typically contact the end effector 60 on the flat surface areas 68.

Figure 10:
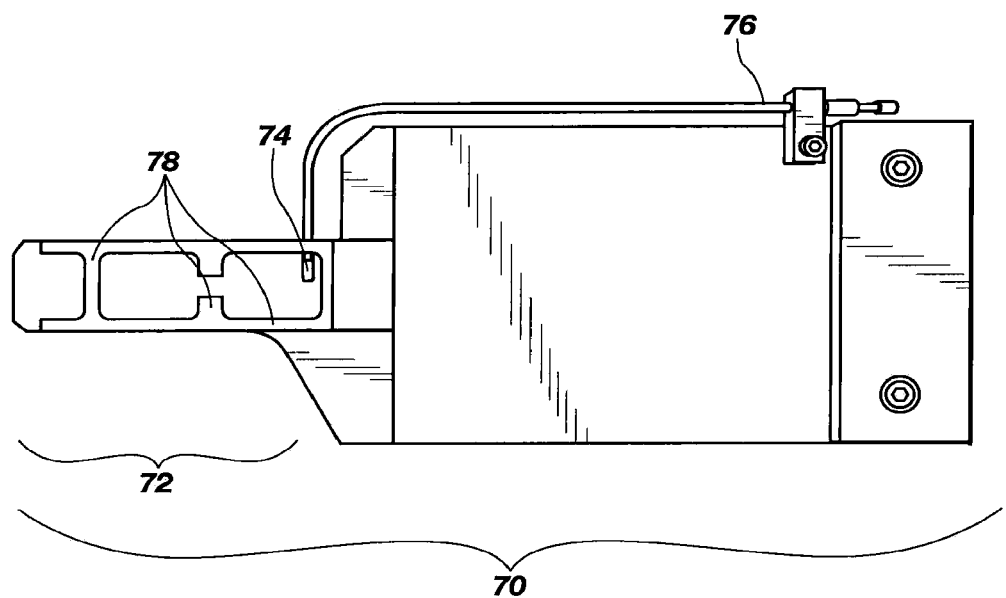
FIG. 10 is a plan view of a stainless steel end effector with a vacuum cavity and port.

With reference to FIG. 10, in another embodiment, a stainless steel end effector 70 has a tip 72 contacting the center of the cleaning wafer (not shown in FIG. 12), a vacuum port 74 connected to a vacuum tube 76, and flat areas 78 to be contacted by the cleaning wafer. While the geometry of each end effector, e.g. 70, determines the placement of cleaning wafer surface features to facilitate cleaning and release of the cleaning wafer, the material composition of the end effector, e.g., 70, can affect adhesion of the tacky surface cleaning material of the cleaning wafer. The adhesion level of specific metal, plastic, or ceramic components of the end effector, e.g., 70, rotational chuck (not shown in FIG. 12) and main chuck (not shown in FIG. 12) can be accounted for during design of the cleaning wafer.

Figure 11:
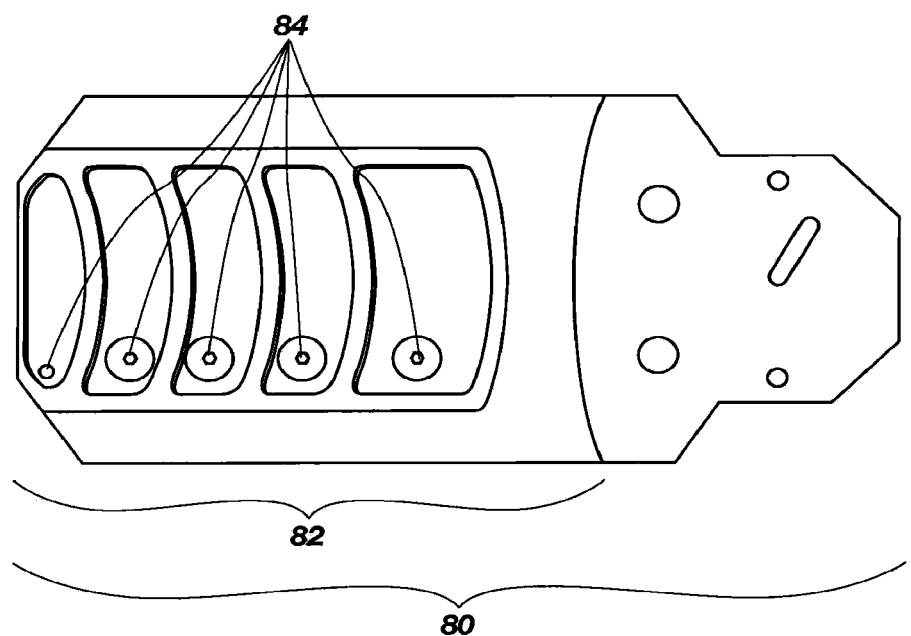
FIG. 11 is a plan view of a bronze dipole arm end effector with multiple vacuum cavities and ports.
Figure 13:
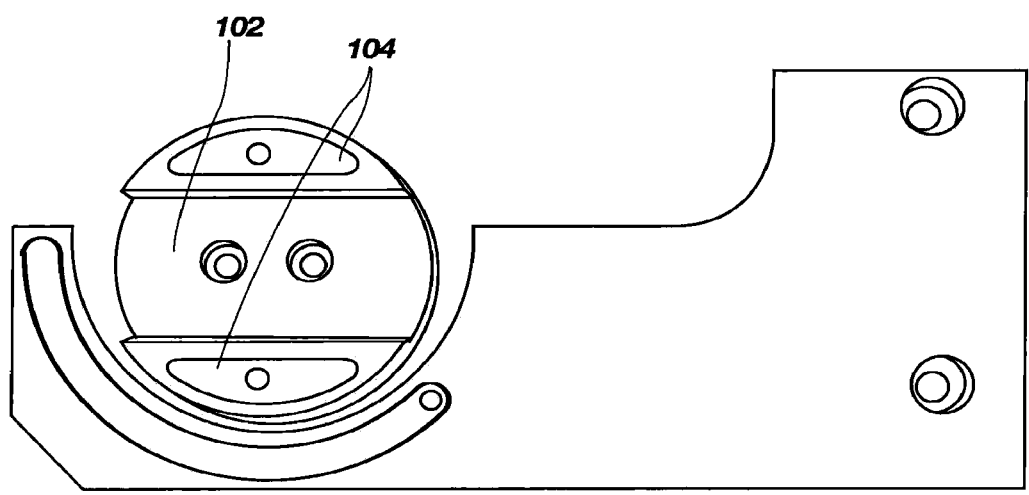
FIG. 13 is a plan view of a Teflon rotational chuck for wafer alignment.

With reference to FIG. 11, in another embodiment, an end effector 80, has a tip 82 that serves to contact the center of the cleaning wafer (not shown in FIG. 13). This end effector 80 has five vacuum ports 84 that can secure the cleaning wafer during transport and cleaning of the end effector 80 if desired.

Figure 12:
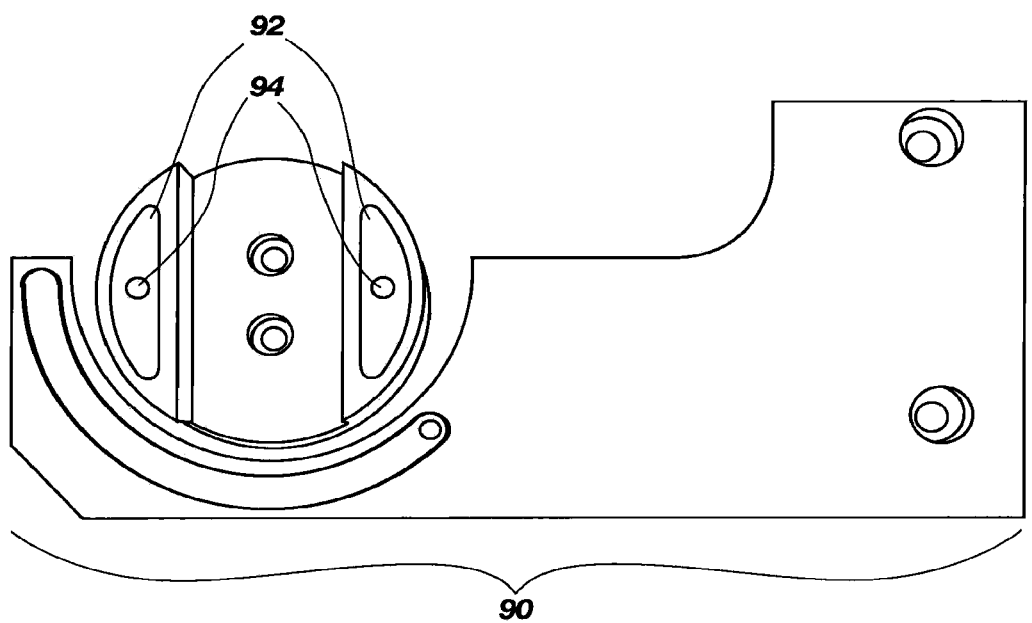
FIG. 12 is a plan view of a stainless steel rotational chuck for wafer alignment.
Figure 14:
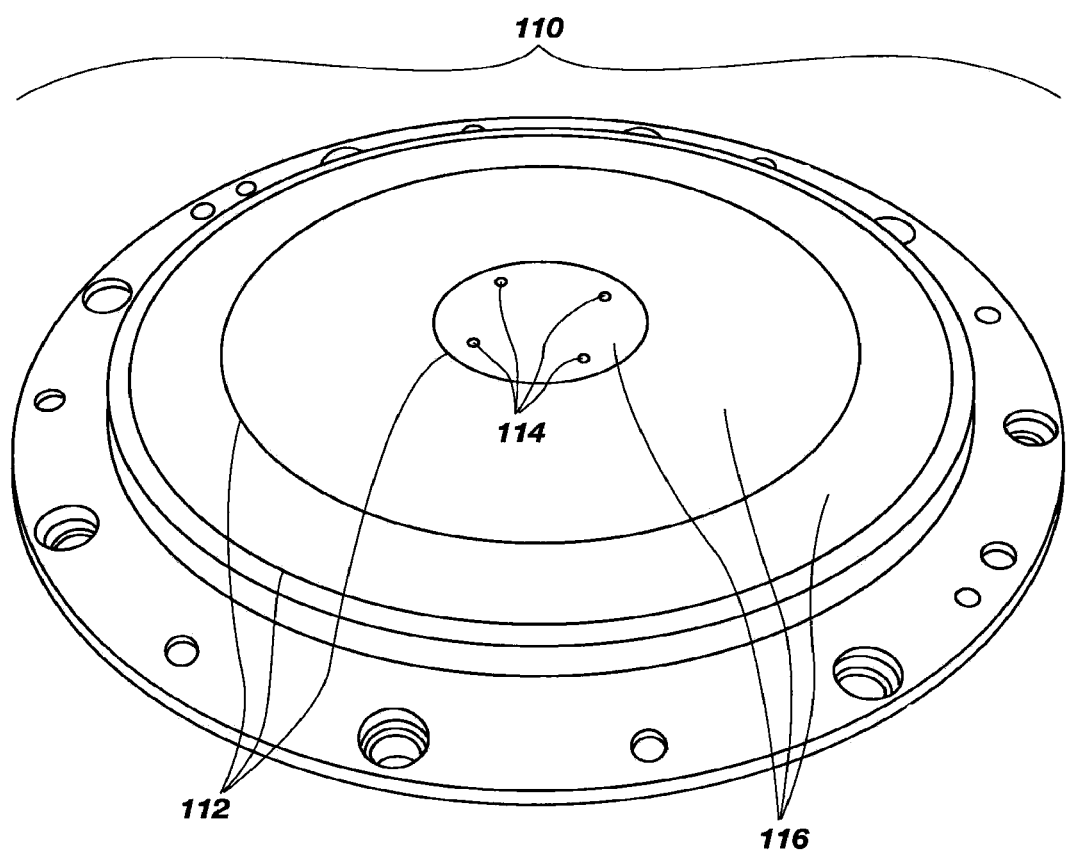
FIG. 14 is a perspective view of an example electrostatic chuck having concentric vacuum rings.

With reference to FIG. 12, in another embodiment, a stainless steel rotational end effector 90 has a rotational arm that rotates and aligns the cleaning wafer during processing within the chip manufacturing apparatus (not shown in FIG. 14). The rotational end effector 90 contains two contact rings 92 with vacuum ports 94 to secure the cleaning wafer (not shown in FIG. 12) during operation. The rotational end effector 90 contacts the center of the cleaning wafer and vacuum secures the cleaning wafer in position on the effector 90.

With reference now to FIG. 13, another embodiment of a polytetrafluoroethylene or Teflon rotational arm end effector 100 is similar in geometry to the stainless steel rotational end effector 90 of FIG. 12. This rotational arm end effector 100 contains two vacuum ports 104 in its rotating disk 102.

From these examples, it is evident that the geometry and surface feature pattern of each chuck cleaning wafer can be custom designed for surface geometry and material composition of each differing type of end effector and each wafer handling tool.

With reference to FIG. 14, one embodiment of a flat electrostatic chuck 110 has concentric vacuum rings 112 containing vacuum ports (not shown in FIG. 14), ejector pin holes 114, and a flat wafer contact surface 116. A cleaning wafer (not shown in FIG. 14) is held in place on the chuck 110 by electrostatic force and upon removal of that force, the cleaning wafer's compressible offset surface features (see FIG. 2, 14, and FIG. 20, 52) facilitate release through stored elastic force from compression. These compressible offset surface features are arranged to avoid contact with the vacuum rings 112 in this case. It is evident that the cleaning wafer cleaning surface features (not shown in FIG. 14) must be custom designed for each wafer handling tool, accounting for the end effector, rotational chuck, and main pin or electrostatic chuck, e.g., 110, while also accounting for the geometry and material compositions of each of these components.

Figure 15:
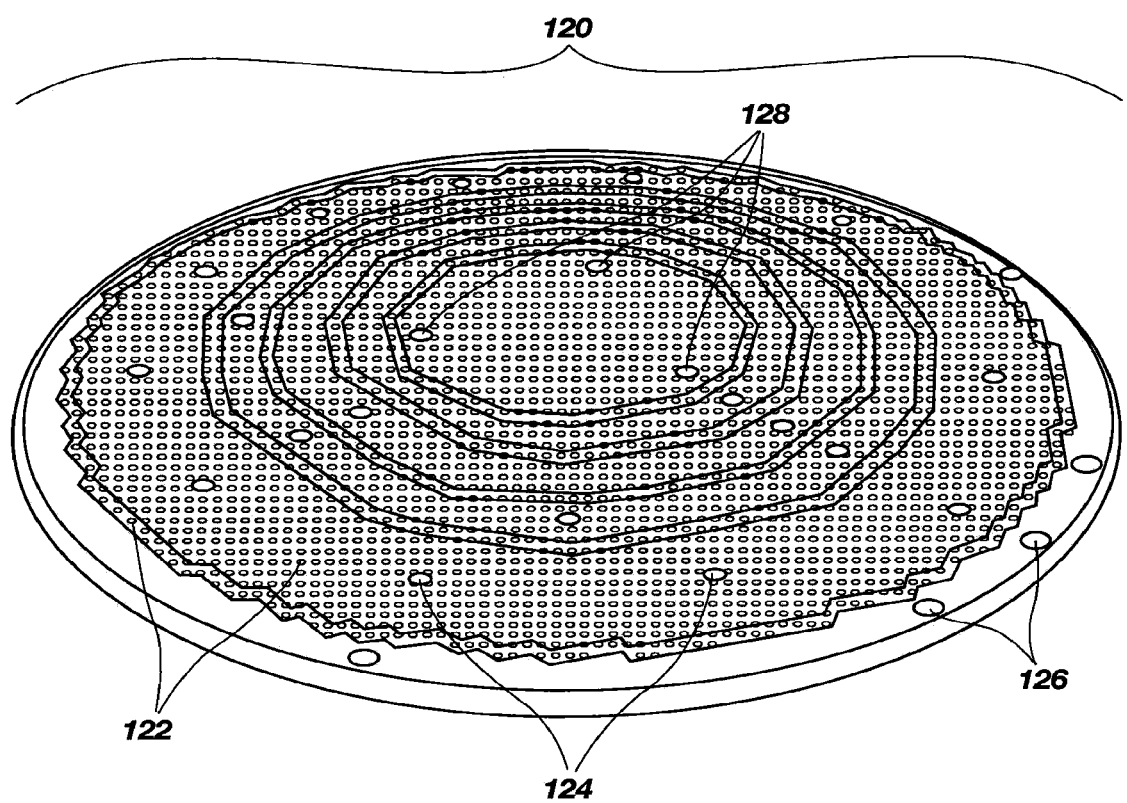
FIG. 15 is a perspective view of a quartz pin chuck showing the pin/burl pattern.

With reference to FIG. 15, an embodiment of a pin chuck 120 with the material composition being quartz and contains protruding pins or burls, e.g., 122, on the surface that contact the cleaning wafer (not shown in FIG. 15) along with vacuum ports, e.g., 124, bolt holes, e.g., 126, and ejector pins 128. The tacky surface of the cleaning wafer contacts the pins and burls, e.g., 122, and is held in contact by vacuum. Upon release of the vacuum, the debris on the pins is bonded to the cleaning wafer surface and removed with the cleaning wafer. As in many embodiments, the protruding surface features on the cleaning wafer are arranged to avoid contact with the pins and burls, e.g., 122, thus allowing flat portions of the cleaning wafer surface to contact and clean the pin array with contact being effected by the vacuum or electrostatic force that impels the cleaning wafer to the pin chuck 120.

Figure 16:
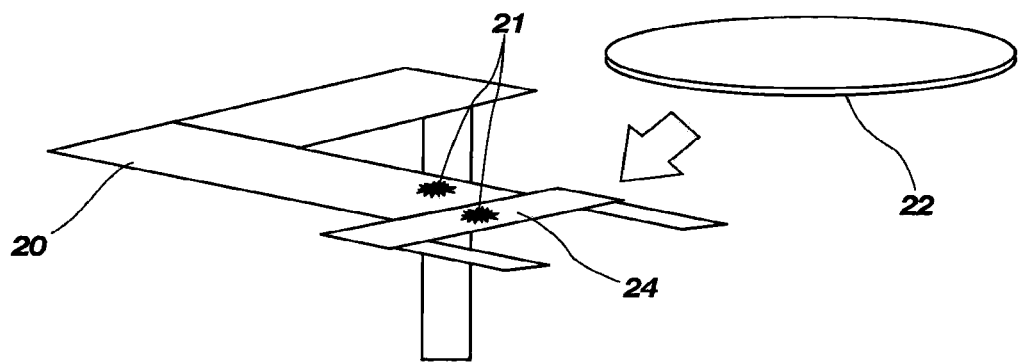
FIG. 16 is a perspective view of debris to be removed from a wafer handling arm by the cleaning wafer.

With reference to FIG. 16, in at least one embodiment, the cleaning wafer 22 is positioned with its cleaning polymer side (not shown in FIG. 16) facing the flat surface 24 of the wafer handling arm 20. When there is foreign particulate matter 25 on the flat surface 24 of the handling arm 20 and the cleaning wafer 22 is picked up by the wafer handling arm 20 for transport to a process stage, during transport the cleaning wafer 22 contacts the surface of the handling arm 20, and the foreign particulate matter 25 then adheres to the cleaning polymer surface 22. Upon release of the cleaning wafer 22 from the handling arm 20 for the next process stage, the foreign particulate matter 25 is collected on the cleaning wafer surface 22 and carried away from the handling arm 20.

Figure 17:
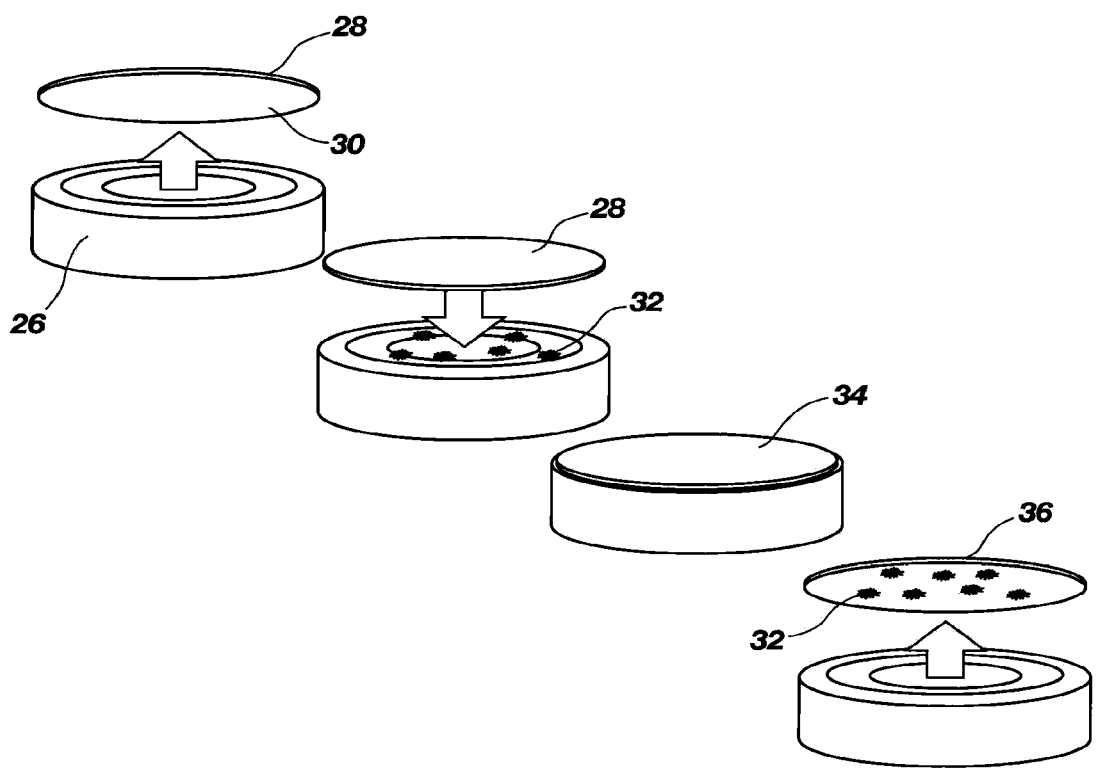
FIG. 17 is a perspective view of a cleaning wafer being loaded onto a wafer stage, contacting the surface, removing particulate matter, and releasing from the stage.

With reference to FIG. 17, in some embodiments, the cleaning wafer 28 with a cleaning polymer side 30 is positioned onto a wafer stage 26. Upon application of a force such as a vacuum at approximately 16 to 24 in. Hg, the cleaning surface 30 of the cleaning wafer 28 makes contact with the surface of the wafer stage 26. If there is foreign particulate matter, e.g., 32, present on the surface of the wafer stage 26, then, upon release of the force holding the cleaning wafer 28 to the wafer stage 26, the foreign particulate matter 32 adheres to the cleaning surface 30 of the cleaning wafer 28 and is thereby removed from the wafer stage 26.

In further detail, still referring to FIG. 17, the cleaning polymer side 30 of the cleaning wafer 30 has protruding compressible offset features (see FIG. 2, 14, and in FIG. 20, 52) designed to inhibit contact between the cleaning wafer 28 cleaning surface and the surfaces of the wafer stage 26 until a vacuum or electrostatic force is applied. Once the force collapses the compressible offset features on the cleaning polymer side 30 of the cleaning wafer 30, the tacky polymer surface or cleaning polymer side 30 contacts the surface of the wafer stage 26 to remove foreign particulates, e.g., 32. In the case of pin or burl chucks the compressible offset features are positioned at locations outside the pin area or in specific locations within the pitch of the pins and burls (see FIG. 18, 44, 46) so that the tacky cleaning surface of the cleaning polymer 30 may make contact with the pin tips to remove debris. The smooth polymer 30 is sufficiently compliant to deform around the burls and micro-burls (see FIG. 18, 44, 46) and collect debris that has accumulated around the periphery of the pin contact surface. In the case of a chuck with vacuum ports, grooves, or vacuum nipples (not shown in FIG. 17), the locations of the compressible offset features of the cleaning wafer 28 polymer surface 30 are placed to facilitate debris collection from within the vacuum features.

With reference to FIG. 18, in some embodiments a cleaning wafer (not shown in FIG. 20) is constructed with a compliant cleaning polymer 38 that is capable of conforming around pins, e.g., 40, on a wafer pin stage 41. The compliant cleaning polymer 38 contacts the foreign particulate matter, e.g., 42, on the wafer stage pins, e.g., 40, for collection and removal from the wafer stage pins 40. The compliant polymer 38 may also conform around microburls, e.g., 44, on a wafer stage pins, e.g., 40 to contact the foreign particulate matter, e.g., 46, for collection and removal from the wafer stage 41.

In certain embodiments, with reference now to FIG. 18, the compliant cleaning wafer's cleaning polymer 38 conforms around the pins 40 on the wafer pin stage upon application of a vacuum force. In some embodiments, the polymer 38 is sufficiently compliant to deform around the burls or pins 40 and micro-burls, e.g., 44, and collect debris e.g., 42, 46 that has accumulated around the periphery of a pin contact surface, e.g., 44. The protruding compressible offset surface features (not shown in FIG. 18) the cleaning wafer (not shown in FIG. 18) placed outside of the pins, e.g., 40, allows the relatively smooth area of the cleaning wafer polymer 38 to contact the pin surfaces, e.g. 40. The protruding compressible offset surface features (not shown in FIG. 18) may be placed to match locations of vacuum ports, grooves, or vacuum nipples (not shown in FIG. 18) to facilitate debris collection from within the vacuum features (not shown in FIG. 18).

Figure 19:
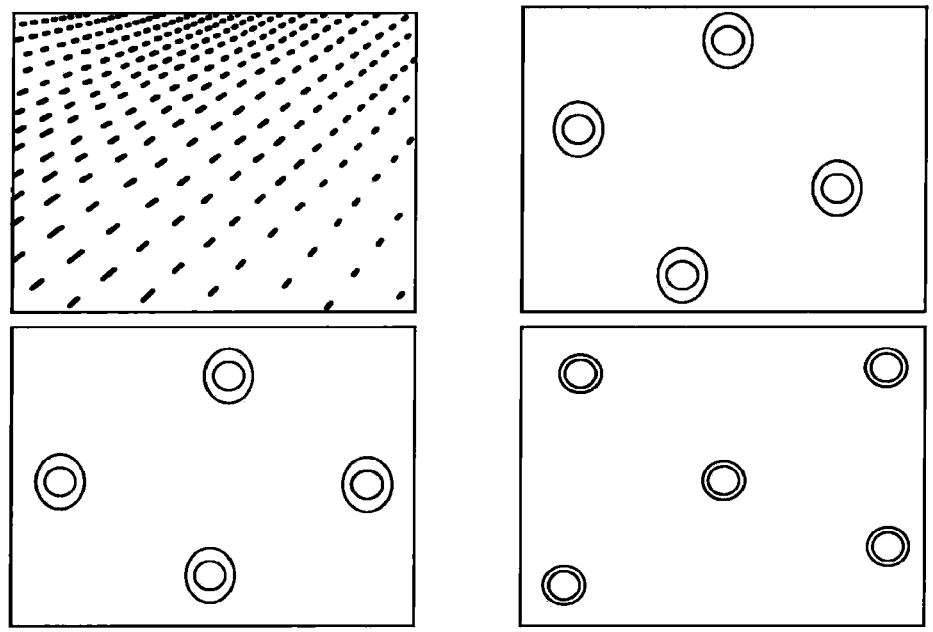
FIG. 19 is a series of photographs showing a pin array on a pin chuck surface, a higher magnification of debris on the pins, a higher magnification of the pins after cleaning with the chuck cleaning wafer, and a higher magnification of debris captured on the cleaning polymer surface.

With reference to FIG. 19, in at least one embodiment, wafer handling equipment to be cleaned contains a quartz pin chuck, upon the surface of which are an array of pins, e.g., section 8.A.1. During the photolithographic manufacturing process and prior to cleaning with the cleaning wafer (not shown in FIG. 19), debris accumulates around the pins on the pin chuck surface, e.g., visible in the higher magnification of section 8.A.2. The debris is typically transported in and left on the chuck pins by the silicon process wafers (not shown in FIG. 19). Immediately after contact with the cleaning wafer polymer e.g., section 8.A.4, the loose debris has been removed from the pin tip and circumference, e.g., section 8.A.3 and now the residual debris that was removed from the pins resides on the surface of the cleaning polymer, e.g., section 8.A.4. In this and other embodiments, the cleaning polymer, e.g., section 8.A.4, does contact the pins and is compliant enough to conform around the pin tip and somewhat down the side, and the cleaning polymer is sufficiently tacky to bond to and remove loose debris from the chuck pins.

Referring now to FIG. 20, in some embodiments, a cleaning wafer 49, with a cleaning polymer surface 50 on a wafer-like substrate 48 has protruding and compressible surface features, e.g., 52, on the cleaning polymer 50 that provide offset and limit contact between the cleaning polymer surface 50 and a wafer stage surface 54. The elastic polymer formed on the cleaning wafer surface 50 to produce protruding and compressible features, e.g., 52, provides offset or minimal contact with the flat surfaces of the wafer stage 54 until a vacuum or electrostatic force is applied. Once the vacuum force collapses the compressible offset features, e.g., 52, the tacky polymer surface 50 contacts the surface 54 of the wafer stage 51 to remove foreign particulates, e.g., 56. Upon release of the compression force, the offset features, e.g., 52 rebound and facilitate release from the wafer stage 51 while the foreign particulate matter 56 adheres to the cleaning polymer 50 and is removed from the wafer stage 51.

The polymeric cleaning material 50, should have a measurable surface tack between 0.01 and 10 psi using standard ASTM based methods for collection of foreign particulate and to allow release of the cleaning material 50 from the stage surface 54 depending on stage geometry. The surface features, e.g., 52, are also dependent on the chuck or stage geometry. In some embodiments, features that collapse on a wafer stage, such as wafer stage 54, to allow contact for debris collection may usually do so at less than 6 psi vacuum force. The surface tack of the cleaning material 50 is typically low enough that the cleaning wafer 49 releases from the wafer stage 51 at less than 4.5 psi pressure on each ejector pin (normally at about 3.0 psi pressure). In at least one method of use, the vacuum is held for a minimal period such as 5 to 15 seconds, which allows full contact of cleaning surface 50 on the wafer stage 51 to collect debris but facilitates release.

A cleaning wafer can be loaded and cycled automatically in most tools but may also be loaded manually in tools with access to the main chuck such as an ASML PAS5500 stepper. The cleaning wafer can also be manually loaded into a plasma vapor deposition tool such as Applied Materials Endura HP by processing in the first pre-clean chamber to control debris accumulation. While reducing cycle time of the vacuum on a pin chuck facilitates release of the cleaning polymer while retaining cleaning effectiveness the same can be accomplished on an electrostatic chuck by reducing cycle time to 5 to 15 seconds and reducing the applied voltage to 150V or less.

Figure 21:
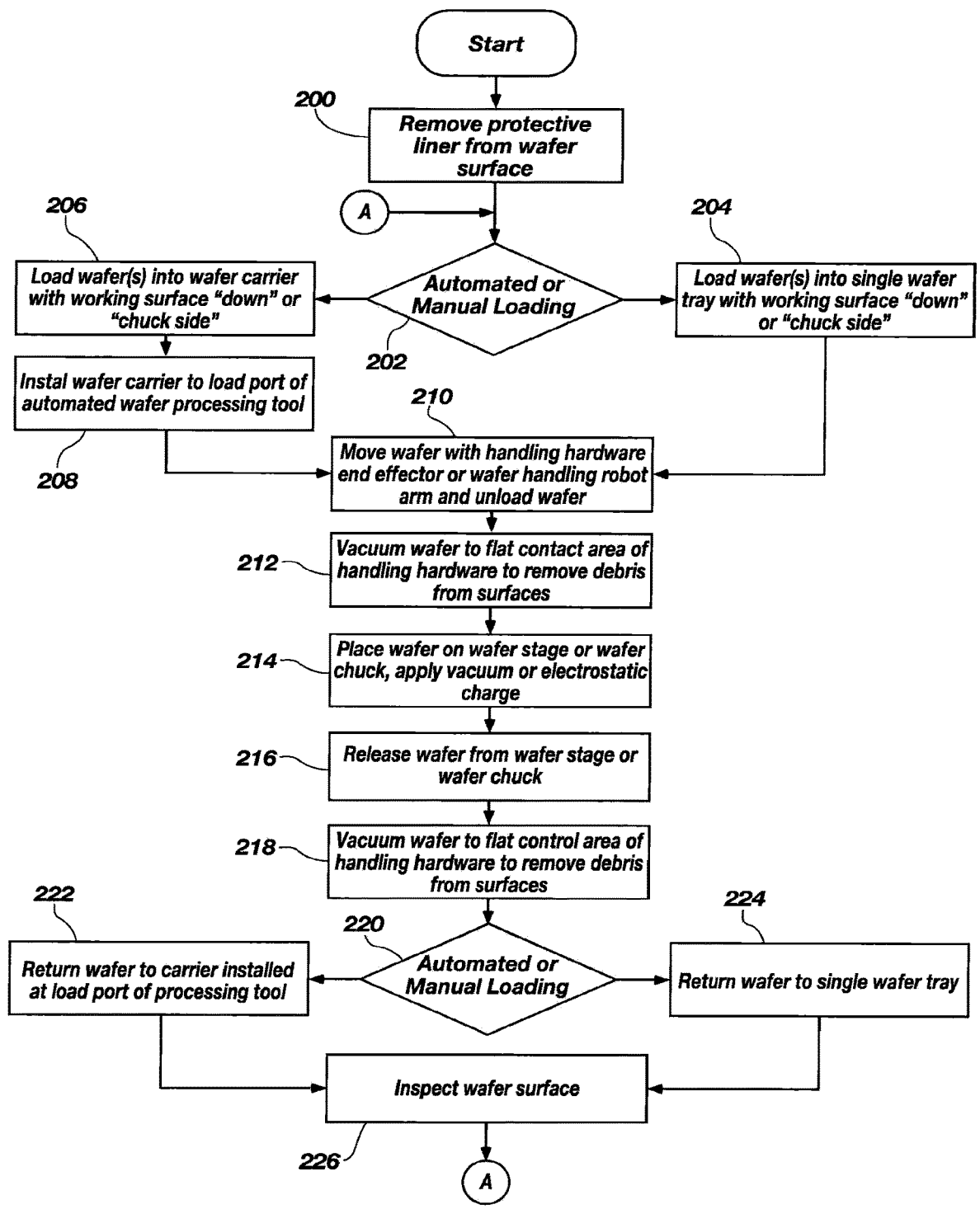
FIG. 21 is a flow chart showing example process steps for use of a cleaning wafer in an automated integrated chip wafer manufacturing tool.

Referring now to the flowchart of FIG. 21 in conjunction with the diagrams of FIG. 2 and FIG. 8, in one embodiment of a method of implementation, the cleaning wafer 10 is securely wrapped to protect it from contamination during shipment and pre-cleaning handling. At step 200, upon first usage of the cleaning wafer, the protective surface liner is removed and discarded. At step 202, wafer substrate 10 may be manually loaded or loaded in an automated manner. At steps 204 and 206, a single cleaning wafer 22 or multiple wafers 22 may be placed cleaning material side down (or wafer side up) in a wafer carrier 24, wafer tray, or other wafer loading device of the desired wafer processing tool. At step 202, the cleaning wafer 22 or cleaning wafers 22 are automatically removed from the wafer carrier 24 or wafer tray and cycled through processes of the tool under normal conditions. The cleaning wafer may be cycled with the cleaning surface 12 facing down throughout the handling process. Within the tool, standard handling is facilitated by the wafer's protruding surface features, e.g., 14, which keep the cleaning surface 12 offset from the surfaces of the handling equipment. At step 208, wafer carrier 24 may be installed to a load port of the automated wafer processing tool.

At step 210, the wafer substrate 10 may be moved with, for example, handling hardware, end effector, or a wafer handling robot arm 20 and then unloaded.

At step 212, debris 25 is removed via vacuum of the flat contact area of the handling hardware. At step 214, the wafer 10 is placed on wafer stage 26, wafer chuck apply vacuum or electrostatic charge. At step 216, the wafer may be released from the wafer state 26 or wafer chuck. Similar to step 212, at step 218 debris 25 may be removed via vacuum of the flat contact area of the handling hardware. At step 220, wafer substrate 10 may be manually loaded or loaded in an automated manner.

At step 222, the wafer 10 is returned to wafer carrier 24 installed at the load port of the processing tool. Alternatively, at step 224 the wafer 10 is returned to a single wafer tray. At step 226, the wafer surface is inspected.

Thus, in some embodiments shown by way of example in FIG. 21, the cleaning media 12 is placed on the surface of each wafer chuck or wafer stage 26 within the automated wafer processing tool, makes near full or full surface contact through vacuum assist on a flat stage or by resting on the burls in a pin chuck for a specific dwell time, collects foreign particulate matter 25, and is then cycled back to the wafer carrier tray 24 and subsequently unloaded.

In some embodiments, the method of creating a cleaning wafer begins with the wafer handling equipment manufacturer providing details on the wafer handling components and chuck geometry of the specific equipment for which the cleaning wafer is intended. Based upon the manufacturer specifications, several potential designs are prepared and prototype cleaning wafers produced. These prototype cleaning wafers have a low level of tack, for example, a level 3 on a scale from 1 to 10 for desired range of tack for a given application or tool. These prototype cleaning wafers are run through the actual machine, with each design and geometric configuration being tested for consistency of successful throughput and quantity of foreign particulate accumulated.

Based upon the results of the initial tests, the designs are modified and new prototype cleaning wafers are produced. These new, revised prototype cleaning wafers are then tested with increasingly higher levels of tack, determining for each design, what is the highest level of tack it can include and yet still function with acceptable consistency. The cleaning wafer that performs the best in the tests is then designated to be the cleaning wafer for that particular wafer handling equipment.

In other embodiments, a cleaning wafer may be comprised of two polymer cleaning surfaces, positioned on opposite faces of the cleaning wafer. In some embodiments, a two-sided cleaning wafer is designed for use in wafer bonding equipment. Wafer bonders join two or more aligned substrates to create an integrated circuit. The substrates can be joined, or bonded, using the following techniques: fusion bonding, anodic bonding, eutectic bonding, solder bonding, glass frit bonding, adhesive bonding. Temporary wafer bonding is performed on thinned wafers placed on a carrier for support. This process is used mainly to manufacture 3D integrated circuits. SUSS MicroTec produces equipment that supports these bonding techniques. A two-sided cleaning wafer may be manufactured using the techniques described above, but for each side of the wafer. This can yield a cleaning wafer having predetermined surface features on both sides to clean components of bonding equipment by cycling the wafer through the equipment. Two sided cleaning wafers may also be utilized to clean wafer handling equipment in other circumstances, such as when having two cleaning surfaces is advantageous to clean two or more components, at least one with one side of the cleaning wafer and another with the other side. The cleaning wafer could also similarly include other sides having such predetermined features to clean yet other components in wafer handling equipment.

In other embodiments, a cleaning wafer may be designed to remove debris from areas of photolithography tools, such as reticles, mask frames, mask loading equipment, and the mask surfaces. Reticles or masks contain the image of the particular circuit pattern that is projected onto the wafer surface in a stepper or scanner for example. In a manner similar to that described in the wafer process through the tool, debris can accumulate along the mask area on the handling equipment used to load and unload the mask, the frame that holds the mask, and on the mask surface. Similar cleaning material with the same product attributes including surface features may also be used to remove debris from this area of the tool. The material in this case may be mounted to a surrogate mask such as a quartz block to transport the cleaning material though the tool and allow it to contact the handling surfaces to remove accumulated debris. It will also allow contact with the frame that holds the mask here if debris is present it may not allow the mask to seat properly and cause focus issues. The cleaning material may also contact the mask surface offline to remove debris before installing the mask in the photolithography process. This procedure can provide non-destructive cleaning, particularly as compared the techniques that apply solvents or manual scrubbing or abrasion that reduce the lifetime of the mask.

It can thus be seen that the embodiments described above may provide many advantages. They can include in some embodiments:

more efficient wafer stage cleaning with less or even no tool downtime;
improved and more effective wafer handling cleaning;
more economical wafer handling equipment cleaning;
more productive wafer handling equipment cleaning; and
less corruption of the wafer handling hardware, wafer stage, and wafer chuck during the cleaning process.

While the foregoing written description enables one of ordinary skill to make and use what is considered presently to be the applicants' best and other modes, those of ordinary skill will understand and appreciate the existence of variations, combinations, and equivalents of the specific embodiments, methods, and examples set forth in this specification.

We claim:

1. A semi-conductor manufacturing apparatus cleaning wafer comprising in combination:
   (i) a resilient cleaning pad body having a cleaning side with a tacky area; and
   (ii) a compressible projection section separate from the tacky area and protruding outwardly from the cleaning side of the cleaning pad body, the projection section urging the wafer away from a surface in the semiconductor manufacturing apparatus when the wafer is pressed against the surface.

2. The cleaning wafer of claim 1 wherein the tacky area is planar.

3. The cleaning wafer of claim 1 wherein the tacky area is shaped to conform to the surface in the semiconductor manufacturing apparatus.

4. The cleaning wafer of claim 1 wherein the tacky area comprises two sub-areas of differing thicknesses.

5. The cleaning wafer of claim 4 wherein at least one of the sub-areas is shaped to conform to a surface in the semiconductor manufacturing apparatus.

6. The cleaning wafer of claim 1 wherein the tacky area comprises two sub-areas of differing levels of tack.

7. The cleaning wafer of claim 6 wherein at least one of the sub-areas is shaped to conform to a surface in the semiconductor manufacturing apparatus.

* * * * *